United States Patent
Ju (10) Patent No.: US 6,590,772 B1
(45) Date of Patent: Jul. 8, 2003

(54) CPU AND CIRCUIT BOARD MOUNTING ARRANGEMENT

(76) Inventor: Ted Ju, Keelung (TW)

( * ) Notice: Subject to any disclaimer, the term of this patent is extended or adjusted under 35 U.S.C. 154(b) by 0 days.

(21) Appl. No.: 10/123,240

(22) Filed: Apr. 17, 2002

(51) Int. Cl.[7] .................................................. H05K 7/20
(52) U.S. Cl. ........................ 361/704; 361/717; 361/718; 361/719; 361/760; 361/767; 257/692; 257/697; 257/718; 257/727; 174/16.3; 165/80.3; 165/185; 439/66
(58) Field of Search ................................ 361/703, 704, 361/707, 717–719, 760, 769, 767, 785; 251/706, 707, 712, 713, 717–719, 726, 727; 174/16.3; 165/80.3, 185; 439/66, 70

(56) References Cited

U.S. PATENT DOCUMENTS

| | | | | |
|---|---|---|---|---|
| 5,309,324 A | * | 5/1994 | Herandez et al. ........... 361/734 |
| 5,528,462 A | * | 6/1996 | Pendse ........................ 361/767 |
| 5,641,945 A | * | 6/1997 | Abe et al. .................... 174/261 |
| 5,761,036 A | * | 6/1998 | Hopfer et al. ............... 361/704 |
| 6,007,349 A | * | 12/1999 | Distefano et al. ............. 439/71 |
| 6,016,254 A | * | 1/2000 | Pfaff ........................... 361/769 |
| 6,164,981 A | * | 12/2000 | Lin et al. ...................... 439/70 |
| 6,286,208 B1 | * | 9/2001 | Shih et al. ..................... 29/879 |
| 6,330,164 B1 | * | 12/2001 | Khandros et al. ........... 361/760 |
| 6,396,701 B1 | * | 5/2002 | Nakamura et al. .......... 361/706 |
| 6,449,162 B1 | * | 9/2002 | Corbin et al. ................ 361/719 |

* cited by examiner

*Primary Examiner*—Boris Chervinsky
(74) *Attorney, Agent, or Firm*—Bacon & Thomas (57) ABSTRACT

A CPU and circuit board mounting arrangement in which a CPU connector is installed in a circuit board for top loading of a CPU to electrically connect respective bottom pads of the CPU to respective contacts of the circuit board by respective sloping terminals in the CPU connector, and a pressure member is pivoted to the CPU connector and locked to hold down the CPU in positive contact with the terminals of the CPU connector.

7 Claims, 9 Drawing Sheets

CPU AND CIRCUIT BOARD MOUNTING ARRANGEMENT

BACKGROUND OF THE INVENTION (a) Field of the Invention

The present invention relates to a CPU and circuit board mounting arrangement and, more particularly to such a CPU And circuit board mounting arrangement, which enables a CPU without contact pins to be vertically loaded in a CPU connector and electrically connected to a circuit at the bottom side of the CPU connector.

(b) Description of the Prior Art

Figure 1:
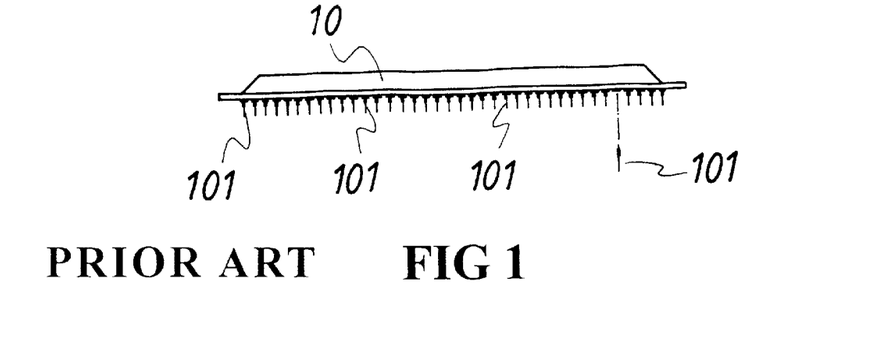
FIG. 1 illustrates a CPU with pins according to the prior art.
Figures 2, 3:
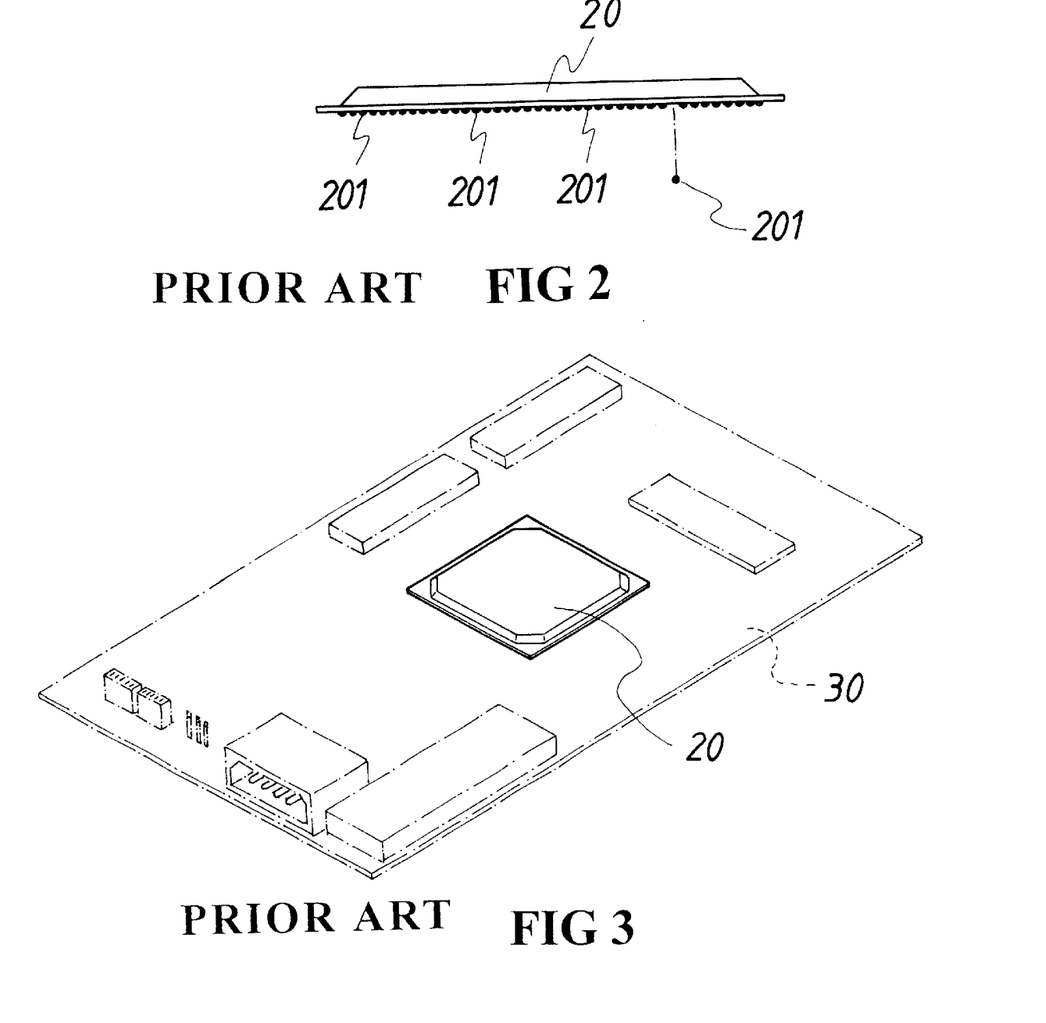
FIG. 2 illustrates a CPU with solder balls according to the prior art.
FIG. 3 illustrates a CPU with solder balls installed in a circuit board according to the prior art.

Regular CPUs, subject to their mounting design, include two types, i.e., the CPU 10 with pins 101 (see FIG. 1), and the CPU 20 with solder balls 201 (see FIG. 2). The procedure of installing pins 101 in the bottom pads of the CPU 10 is complicated and critical. In order to achieve satisfactory electric conductivity, the pins 101 are plated with a layer of gold. The gold coating greatly increases the cost of the pins 101. Further, the pins 101 may be biased or broken during installation. The CPU 20 shown in FIG. 2 is provided with solder balls 201 at the bottom side for reflow-soldering to a circuit board 30 directly (see FIG. 3). The CPU mounting design still has drawbacks. The use of the expensive cost of the solder balls 201 greatly increases the installation cost. The installation of the solder balls 201 is also complicated. Furthermore, the CPU 20 cannot be removed from the circuit board 30 for repair or replacement when soldered.

Figure 4:
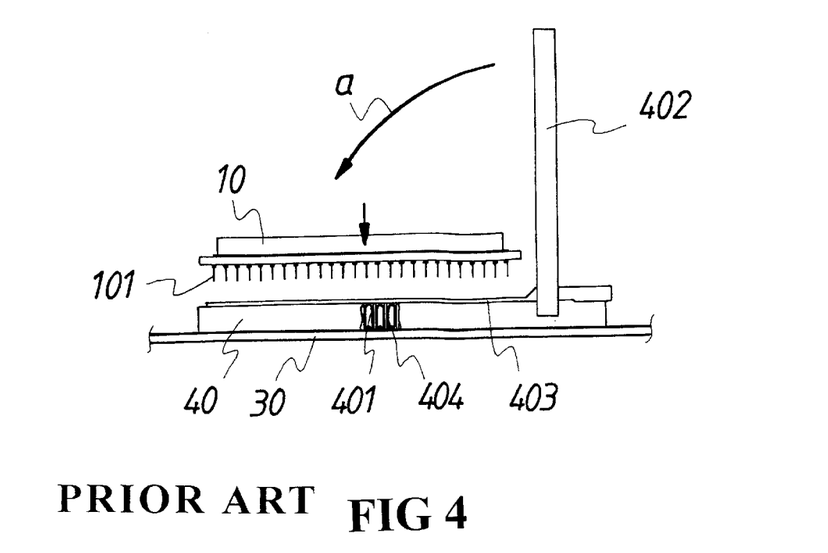
FIG. 4 illustrates the installation of a CPU with pins in a CPU connector at a circuit board according to the prior art.
Figure 5:
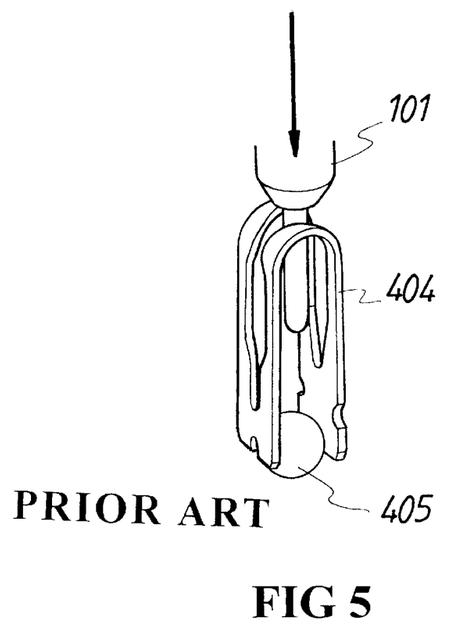
FIG. 5 illustrates the CPU pin suspended in the terminal slot and spaced from the corresponding contact plate.
Figure 6:
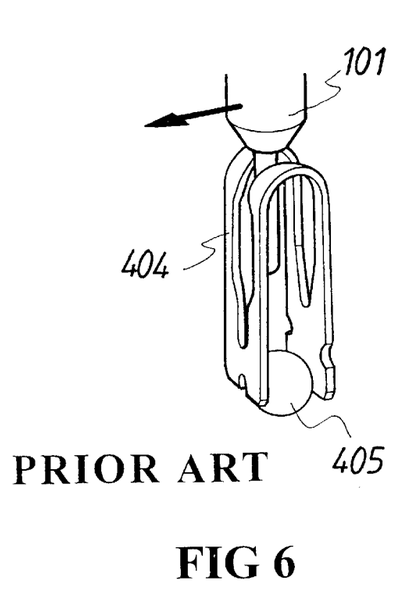
FIG. 6 is similar to FIG. 5 but showing the CPU pin forced into contact with the corresponding contact plate.

FIG. 4 shows the installation of the CPU 10 with pins 101 in a CPU connector 40 at a circuit board 30. During installation, the pins 101 of the CPU 10 are respectively inserted into the respective terminal slots 401 of the CPU connector 40, and then the locking lever 402 of the CPU connector 40 is turned in direction "a" to shift the top cover plate 403 of the CPU connector 40 forwards from the unlocking position to the locking position, thereby causing the pins 101 to be moved from the non-contact position shown in FIG. 5 to the contact position shown in FIG. 6 where a pin 101 is forced into contact with a respective contact plate 404, which is provided with a solder ball 405 at the bottom side that is reflow-soldered to the circuit board 30. This CPU and circuit board mounting arrangement enables the user to detach the CPU 10 from the circuit board 30 for repair or replacement. However, the gold coating of the pins 101 greatly increases the cost of the CPU 10. Further, the pins 101 may be biased or broken during installation.

As indicated above, the aforesaid CPU connector 40 comprises a horizontally slidably top cover plate 403, and a locking lever 402 adapted for moving the top cover plate 403 between the locking position and the unlocking position. This design of CPU connector 40 does not fit the CPU 20 with solder balls 201.

SUMMARY OF THE INVENTION

The present invention has been accomplished to provide a CPU and circuit board mounting arrangement, which eliminates the aforesaid drawbacks. According to one aspect of the present invention, the CPU and circuit board mounting arrangement comprises a circuit board, a CPU connector soldered to the circuit board, and a CPU installed in the CPU connector and electrically connected to respective contacts of the circuit board. The CPU connector comprises a plurality of terminals soldered to respective contacts of the circuit board and so installed that the CPU is vertically loaded in the CPU connector, keeping respective bottom pads of the CPU in contact with the terminals of the CPU connector respectively, achieving electric connection between the CPU and the circuit board. According to another aspect of the present invention, the CPU connector comprises a plurality of terminal slots, which hold the terminals respectively in a sloping position for contacting the bottom pads of the CPU. According to still another aspect of the present invention, the terminals of the CPU connector each have a top contact end sloping in one direction for contacting the bottom pads of the CPU positively. According to still another aspect of the present invention, a heat sink is fastened to the circuit board and pressed on the CPU, keeping the CPU in contact with the terminals of the CPU connector. According to still another aspect of the present invention, a pressure member may be directly pivoted to the CPU connector and locked by lock means to hold down the CPU in the CPU connector, keeping the bottom pads of the CPU in contact with the terminals of the CPU connector positively.

DETAILED DESCRIPTION OF THE PREFERRED EMBODIMENTS

Figure 7:
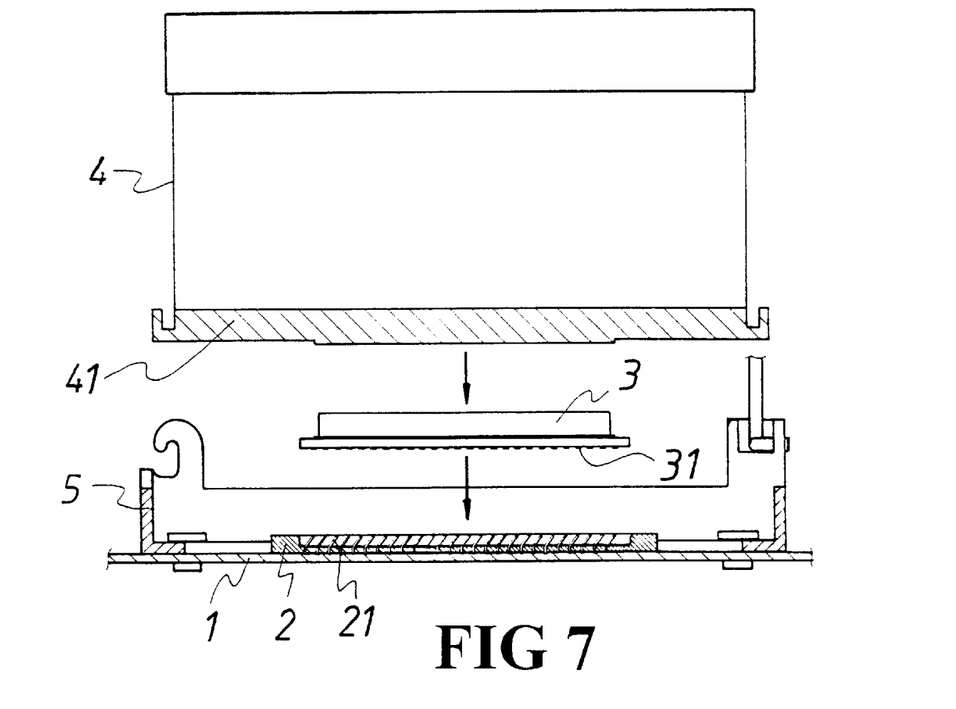
FIG. 7 is an exploded view in section of a first embodiment of the present invention.
Figure 8:
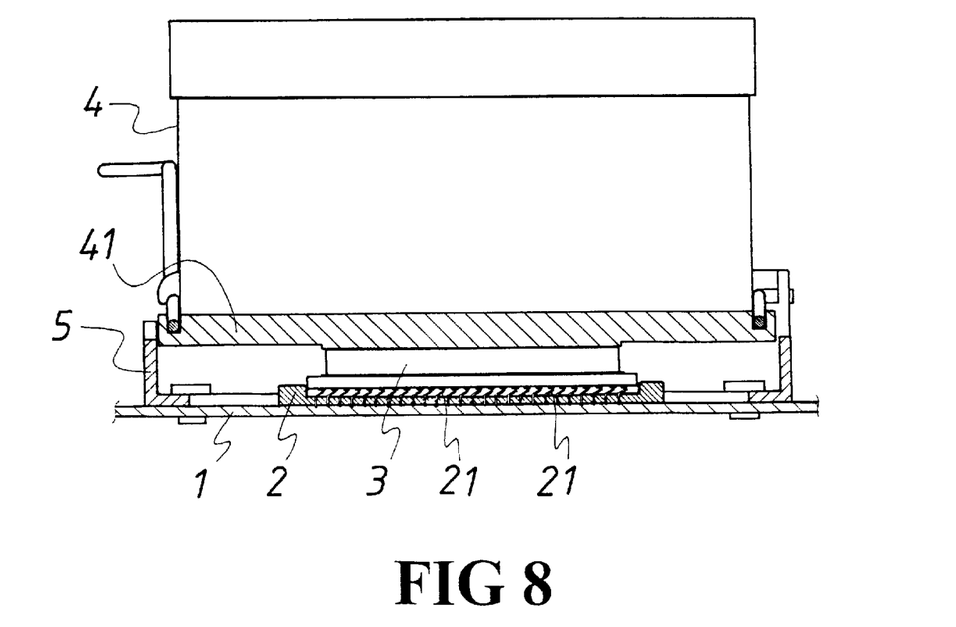
FIG. 8 is a sectional assembly view of the first embodiment of the present invention.

Referring to FIGS. 7 and 8, a CPU and circuit board mounting arrangement in accordance with a first embodiment of the present invention is shown comprising a CPU connector 2 mounted on a circuit board 1, and a CPU 3 directly mounted on the CPU connector 2. The CPU connector 2 comprises a plurality of terminals 21 respectively soldered to respective contacts of the circuit board 1 for top loading of the CPU 3. The CPU 3 has bottom pads 31 respectively disposed in contact with the terminals 21 of the CPU connector 2.

Figure 9:
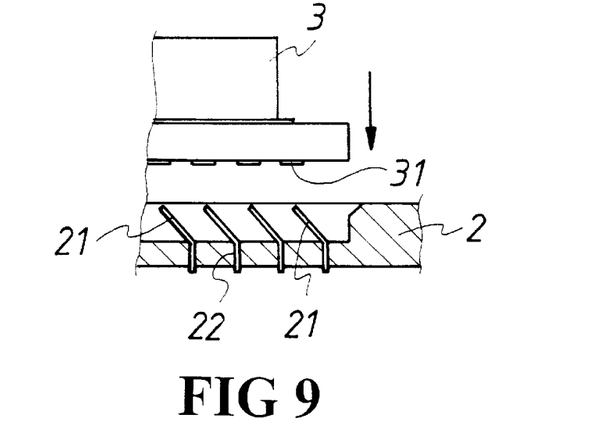
FIG. 9 is a schematic drawing showing top loading of the CPU in the CPU connector and the terminals of the CPU connector sloping in one direction.
Figure 10:
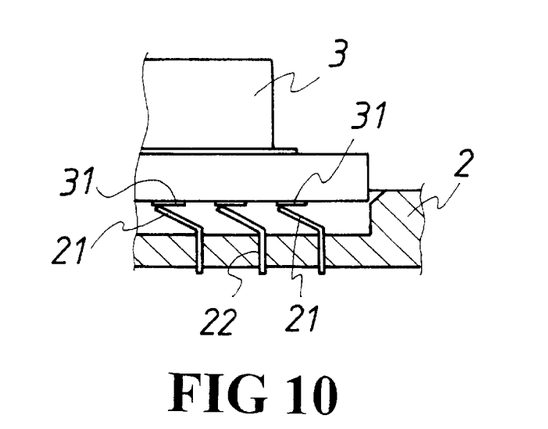
FIG. 10 is similar to FIG. 9 but showing the CPU loaded in the CPU connector, the bottom pads of the CPU disposed in contact with the terminals of the CPU connector.

Referring to FIGS. 9 and 10, the CPU connector 2 has a recessed top side adapted for accommodating the CPU 3 (see FIG. 8). The terminals 21 are respectively installed in respective terminal slots 22 in the CPU connector 2. The terminals 21 are springy, each having a top free contact end sloping in one direction for positive contact with the pads 31 of the CPU 3 respectively. After installation of the CPU 3, the pads 31 are pressed on top free contact ends of the terminals 21 and maintained in contact with the terminals 21 positively (see FIG. 10).

According to the aforesaid arrangement, the pads 31 of the CPU 3 are directly forced into contact with the terminals 21 of the CPU connector 2, therefore it is not necessary to install contact pins in the pads 31 of the CPU 3.

Referring to FIGS. 7 and 8 again, a heat sink holder 5 is fixedly fastened to the circuit board 1 around the CPU connector 2. After installation of the CPU 3 in the CPU connector 2, a heat sink 4 is fastened to the heat sink holder 5 to hold down the CPU 3, keeping the pads 31 of the CPU 3 in positive contact with the terminals 21 of the CPU connector 2 respectively. The heat sink 4 has a flat bottom mounting plate 41, which is maintained in close contact with the top face of the CPU 3 after installation of the heat sink 4 in the heat sink holder 5.

Figure 11:
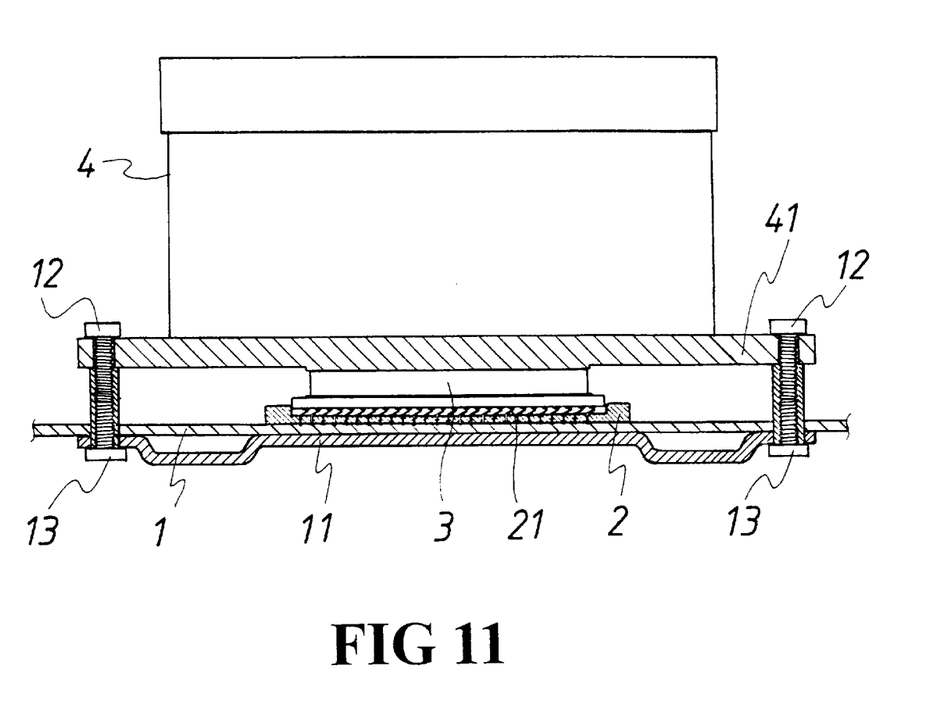
FIG. 11 is a sectional view showing a heat sink fastened to the circuit board and pressed on the CPU against the terminals of the CPU connector according to the present invention.
Figure 12:
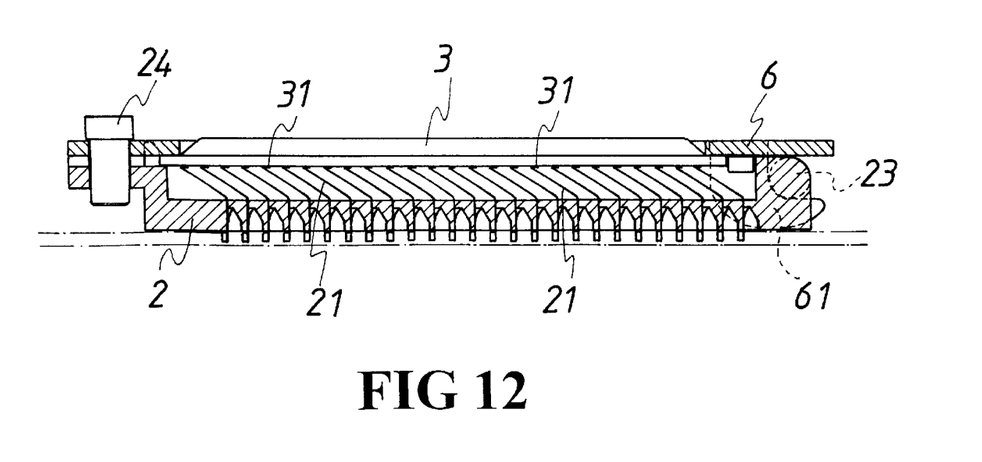
FIG. 12 is a sectional view of a second embodiment of the present invention.
Figure 13:
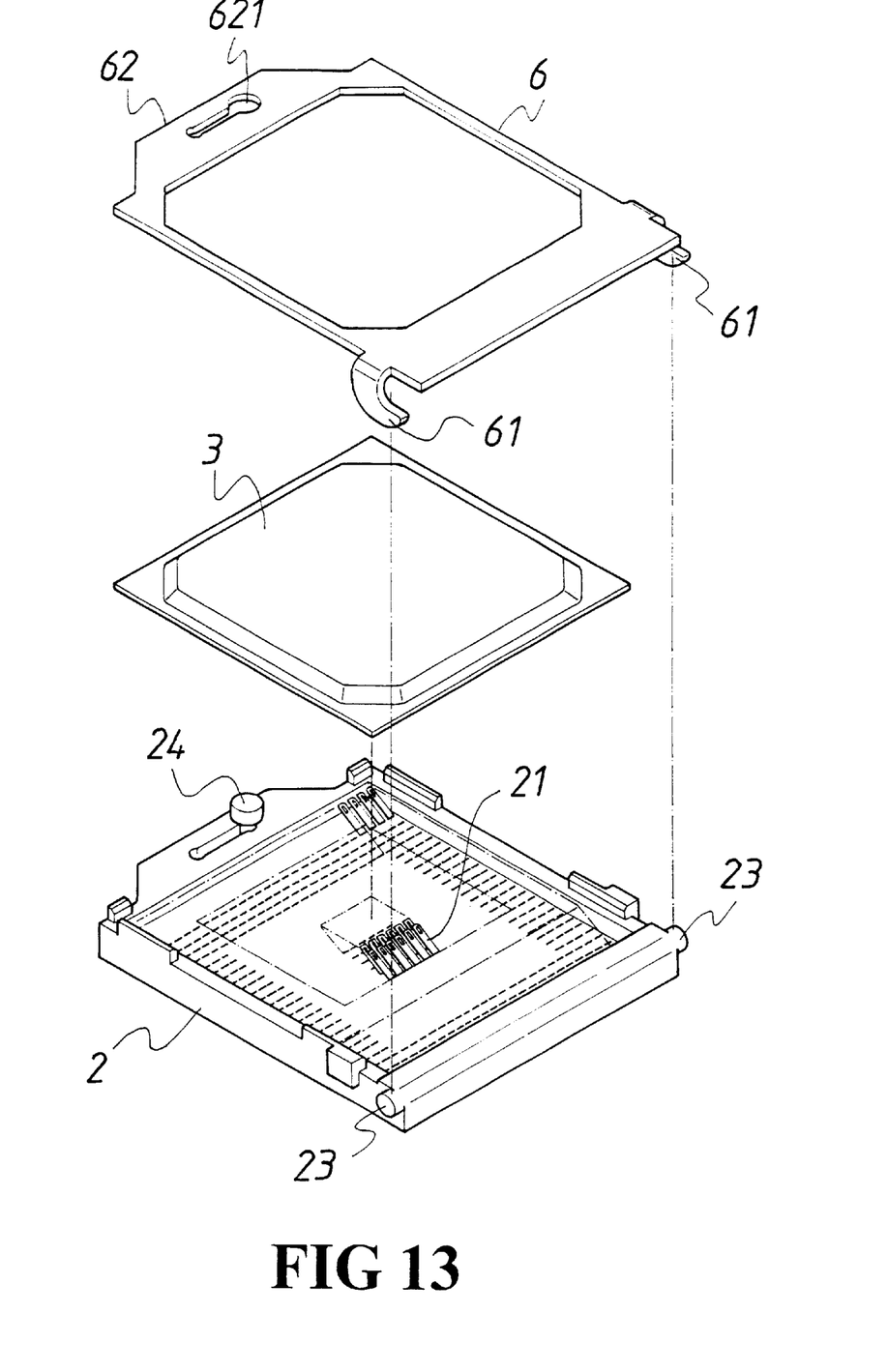
FIG. 13 is a perspective exploded view of the second embodiment of the present invention.
Figure 14:
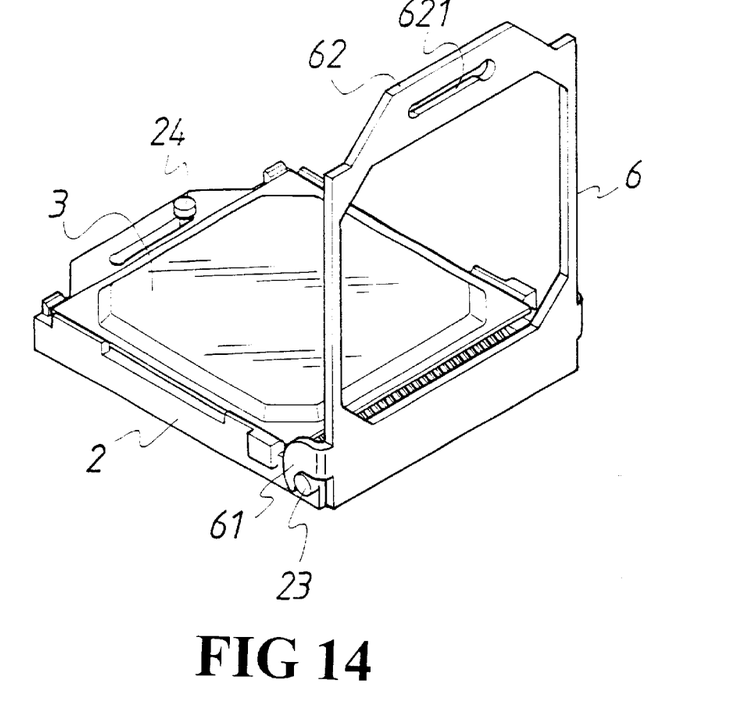
FIG. 14 is a perspective view of the second embodiment of the present invention showing the pressure member opened.

After installation of the CPU 3 in the CPU connector 2, a heat sink 4 may be directly installed in the circuit board 1 to hold down the CPU 3. As shown in FIG. 11, the heat sink 4 has a bottom mounting plate 41 fastened to the circuit board 1 and a reinforcing back frame 11 at the bottom side of the circuit board 1 by male fastening elements and female fastening elements, for example, screws 12 and nuts 13. According to this arrangement, the flat bottom mounting plate 41, the circuit board 1, and the reinforcing back frame 11 have respective mounting holes for receiving the screws 12.

Figure 15:
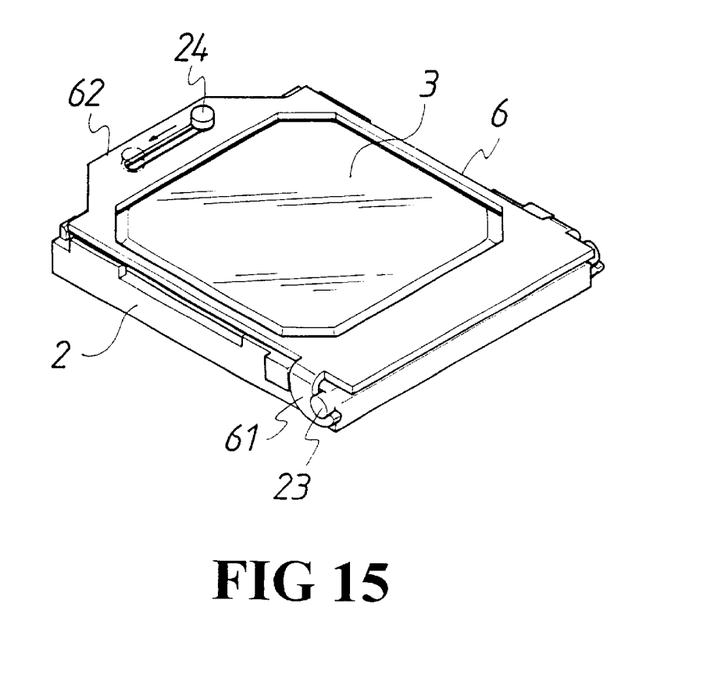
FIG. 15 is similar to FIG. 14 but showing the pressure member closed.

FIGS. from 12 through 15 show a second embodiment of the present invention. According to this embodiment, a pressure member 6 is pivoted to the CPU connector 2 and adapted for holding down the CPU 3 in the CPU connector 2 in positive contact with the terminals 21 of the CPU connector 2. The pressure member 6 is a rectangular open frame comprising two lugs 61 respectively extended from one end of the two opposite lateral sides thereof and pivoted to respective pivot rods 23 at one end of each of the two opposite lateral sides of the CPU connector 2, and a lock hole 621 transversely extended in the front side 62 thereof. The terminals 21 of the CPU connector 2 each have a top free contact end sloping in one direction for positive contact with the pads (not shown) of the CPU 3. The CPU connector 2 comprises a sliding locking bolt 24 corresponding to the transversely extended lock hole 621 of the pressure member 6. When the pressure member 6 closed on the CPU connector 2, the sliding locking bolt 24 is inserted through the expanded right end of the lock hole 621. As this time, the user can move the sliding locking bolt 24 leftwards to the narrow left end of the lock hole 621 to lock the pressure member 6 (see FIG. 15).

Figure 16:
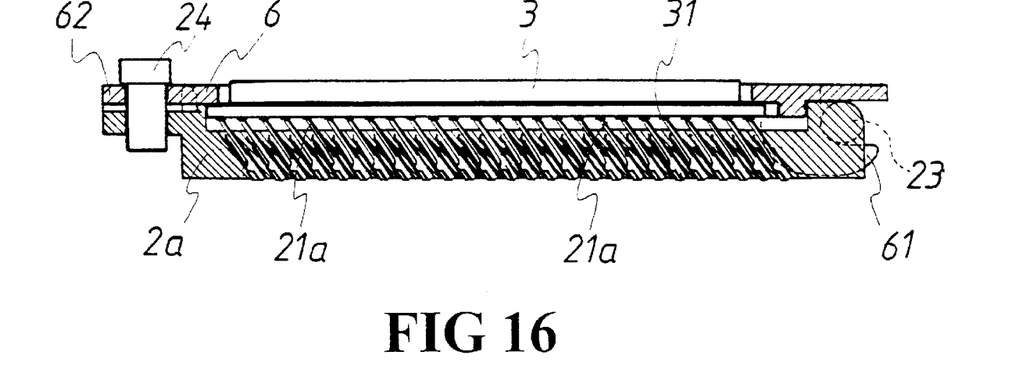
FIG. 16 is a side view in section of FIG. 15.
Figure 17:
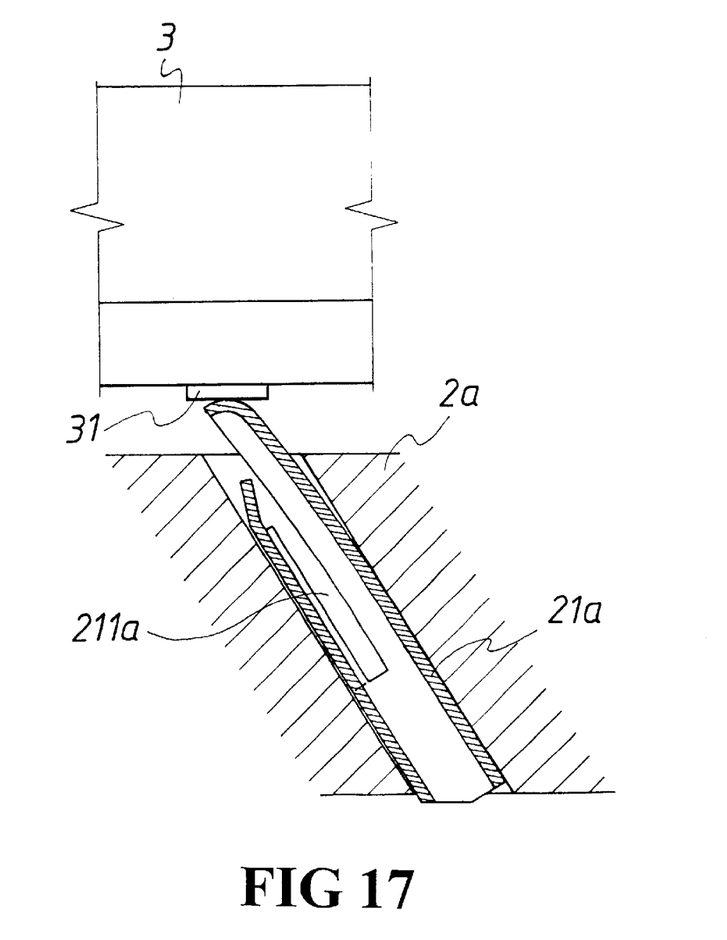
FIG. 17 is an enlarged view of a part of FIG. 16.

Referring to FIGS. 16 and 17, the terminals 21a are installed in the CPU connector 2a and sloping in one direction, each having a longitudinal split 211a in the respective tubular top free contact end. The split 211a makes the top end of the respective terminal 21a springy, so that the corresponding pads 31 of the CPU 3 can be maintained in close contact with the terminals 21a of the CPU connector 2a positively.

Figure 18:
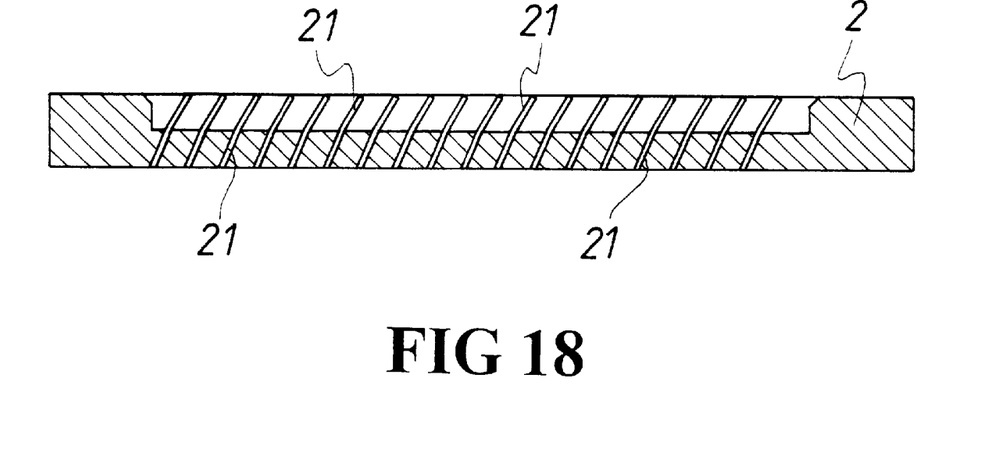
FIG. 18 is a sectional view of another alternate form of the present invention showing the terminals obliquely installed in the CPU connector.
Figure 19:
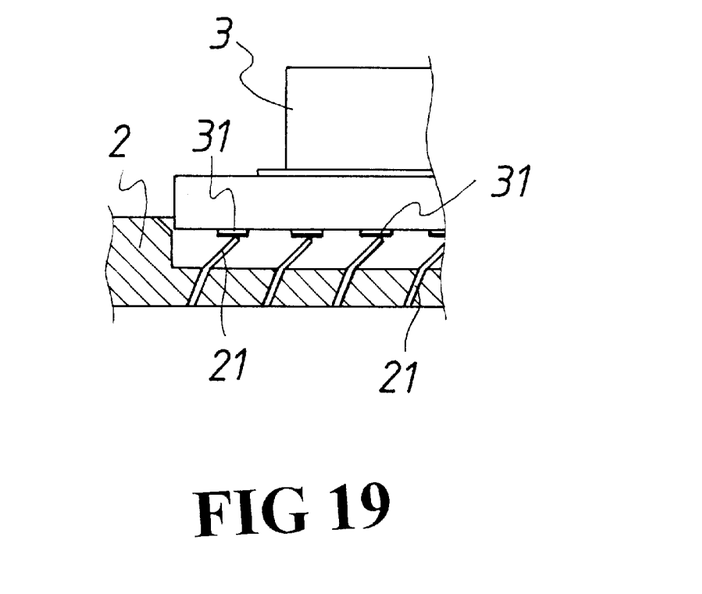
FIG. 19 is an enlarged view of the embodiment of FIG. 18 showing the CPU installed in the CPU connector.

FIGS. 18 and 19 show another alternate form of the present invention in which the terminals 21 are obliquely installed in the CPU connector 2.

A prototype of CPU and circuit board mounting arrangement has been constructed with the features of FIGS. 7~17. The CPU and circuit board mounting arrangement functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A CPU and circuit board mounting arrangement comprising a circuit board, a CPU connector soldered to said circuit board, and a CPU installed in said CPU connector and electrically connected to respective contacts of said circuit board, said CPU having a plurality of bottom pads, wherein said CPU connector comprises a plurality of terminals soldered to respective contacts of said circuit board and so installed that said CPU is vertically loaded in said CPU connector, keeping said bottom pads in contact with the terminals of said CPU connector respectively, achieving electric connection between said CPU and said circuit board; with the provisos that said CPU connector comprises a plurality of terminal slots obliquely installed in said CPU connector and said terminals extend through said terminal slots so that said terminals extending through said slots are held in a sloping direction and said terminals each have a top contact end which slopes in one direction for contacting the bottom pads of said CPU.

2. The CPU and circuit board mounting arrangement as claimed in claim 1, further comprising a heat sink fastened to said circuit board and pressed on said CPU, keeping said CPU in contact with the terminals of said CPU connector.

3. The CPU and circuit board mounting arrangement as claimed in claim 2, further comprising a heat sink holder fixedly mounted to said circuit board for holding said heat sink on said CPU against said CPU connector.

4. The CPU and circuit board mounting arrangement as claimed in claim 1, further comprising a pressure member pivoted to said CPU connector and adapted for holding down said CPU, keeping said CPU in contact with the terminals of said CPU connector.

5. The CPU and circuit board mounting arrangement as claimed in claim 4, wherein said pressure member has a fixed end pivoted to said CPU connector and a free end provided with a lock hole; said CPU connector comprises a sliding locking bolt disposed at one side thereof corresponding to the lock hole of said pressure member and moved between two positions to lock/unlock said pressure member.

6. The CPU and circuit board mounting arrangement as claimed in claim 1, wherein the terminals of said CPU connector each have a tubular top free contact end for contacting the bottom pads of said CPU, and a longitudinal split in said tubular top free contact end.

7. The CPU and circuit board mounting arrangement as claimed in claim 1, further comprising a reinforcing back frame provided at a bottom side of said circuit board, and a heat sink mountable to said circuit board for holding down said CPU in said CPU connector, said heat sink comprising a bottom mounting plate fastened to said circuit board and said reinforcing back frame by male fastening elements and female fastening elements and maintained in contact with a top surface of said CPU.

* * * * *